US008278823B2

(12) United States Patent
Zalyubovskiy et al.

(10) Patent No.: US 8,278,823 B2
(45) Date of Patent: Oct. 2, 2012

(54) THERMO-OPTICALLY FUNCTIONAL COMPOSITIONS, SYSTEMS AND METHODS OF MAKING

(75) Inventors: Sergiy Zalyubovskiy, Niskayuna, NY (US); William Paul Minnear, Clifton Park, NY (US); Vikas Midha, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 467 days.

(21) Appl. No.: 11/694,369

(22) Filed: Mar. 30, 2007

(65) Prior Publication Data

US 2008/0238289 A1 Oct. 2, 2008

(51) Int. Cl.
*H01K 1/50* (2006.01)

(52) U.S. Cl. ........................................ 313/578
(58) Field of Classification Search .................. 313/578
See application file for complete search history.

(56) References Cited

U.S. PATENT DOCUMENTS

| | | | |
|---|---|---|---|
| 3,237,284 A | 3/1966 | Bird | |
| 3,405,328 A | 10/1968 | Johansen et al. | |
| 3,523,207 A | 8/1970 | Johansen et al. | |
| 3,868,230 A | 2/1975 | Krukonis | |
| 3,927,989 A * | 12/1975 | Koo | ................ 419/4 |
| 3,951,870 A | 4/1976 | Economy et al. | |
| 4,196,368 A | 4/1980 | Hauer | |
| 5,148,080 A | 9/1992 | Van Thyne | |
| 5,152,870 A | 10/1992 | Levinson | |
| 5,444,173 A | 8/1995 | Oyama et al. | |
| 5,528,105 A | 6/1996 | Brinn et al. | |
| 5,756,410 A | 5/1998 | Dunmead et al. | |
| 5,811,934 A | 9/1998 | Bunk et al. | |
| 6,084,250 A | 7/2000 | Justel et al. | |
| 6,777,859 B1 | 8/2004 | Arnold | |
| 6,841,937 B2 | 1/2005 | Opitz et al. | |
| 6,903,508 B1 | 6/2005 | Arnold | |
| 7,190,117 B2 | 3/2007 | Rosenbauer | |
| 2002/0096984 A1* | 7/2002 | Konishi et al. | ............ 313/25 |
| 2004/0232837 A1* | 11/2004 | King | ....................... 313/578 |

(Continued)

FOREIGN PATENT DOCUMENTS

CA 876650 A 7/1971

(Continued)

OTHER PUBLICATIONS

"Conditions of Formation and Some Properties of Zirconium Oxycarbides", Institute of Materials Science, Academy of Sciences of the Ukrainian SSR. Translated from Poroshkovaya Metallurgiya, No. 1 (109), pp. 60-64, Jan. 1972. Original article submitted Jun. 18, 1970.*

(Continued)

*Primary Examiner* — Anh Mai
*Assistant Examiner* — Andrew Coughlin
(74) *Attorney, Agent, or Firm* — Mary Louise Stanford

(57) ABSTRACT

A thermo-optically functional composition is disclosed. The composition includes a solid solution of at least two materials selected such that the composition emits thermal radiation, wherein each material is selected from the group consisting of metal carbides, metal nitrides, metal oxides, metal borides, metal silicides and combinations thereof, wherein each metal is selected from the group consisting of tungsten or tungsten alloys, hafnium or hafnium alloys, niobium or niobium alloys, tantalum or tantalum alloys, titanium or titanium alloys, zirconium or zirconium alloys, and combinations of two or more thereof.

21 Claims, 16 Drawing Sheets

U.S. PATENT DOCUMENTS

| | | |
|---|---|---|
| 2005/0212422 A1 | 9/2005 | Rosenbauer |
| 2006/0001344 A1* | 1/2006 | Ohkubo et al. ............... 313/271 |
| 2006/0071585 A1* | 4/2006 | Wang ............................ 313/315 |
| 2006/0103305 A1 | 5/2006 | Bunk et al. |
| 2006/0181187 A1* | 8/2006 | Hosokawa et al. ........... 313/292 |

FOREIGN PATENT DOCUMENTS

| | | |
|---|---|---|
| EP | 0102489 A2 | 3/1984 |
| EP | 0464446 B1 | 10/1996 |
| EP | 464446 B1 | 10/1996 |
| EP | 1037244 A2 | 9/2000 |
| EP | 01594156 A2 | 11/2005 |
| EP | 1594158 A2 | 11/2005 |
| EP | 1206793 B1 | 10/2006 |
| GB | 2032173 A | 4/1980 |
| JP | 55053040 A | 4/1980 |
| JP | 01209634 A | 8/1989 |
| JP | 06148403 A | 5/1994 |
| SU | 1420766 A1 | 1/1992 |
| WO | 01/15206 A1 | 3/2001 |
| WO | WO 01/15207 A1 | 3/2001 |
| WO | WO03019680 A1 | 3/2003 |
| WO | WO2007120435 A1 | 10/2007 |
| WO | WO2007126696 A1 | 11/2007 |

OTHER PUBLICATIONS

Arthur D. Little, Inc.; "Higher Efficiency Filaments for Incandescent Lamps";Final Report to Dept. of Energy/NETL; DE-FC26-99FT40636; Feb. 26, 2002; Revised Apr. 22, 2002 .( 72 Pages).

Friedrich-Wilhelm Fluck; Dissertation: "Optical Researches on Hafnium Carbon Nitrides HfC N , x 1-x"; 1978.(39 Pages).

PCT International Search Report dated Oct. 10, 2008.

Database Inspc [Online] The Institution of Electrical Engineers, Stevenage, GB; Ono K et al.: "High Temperature Synthesis of (Ti W) (C N) Carbonitrides", Dec. 1989, XP002497654, 1 page.

Lengauer et al., "Solid State Properties of Group IVb Carbonitrides", Journal of Alloys and Compounds, vol. 217, pp. 137-147, 1995.

Binder et al., "Phase Equilibria in the Systems Ti-C-N, Zr-C-N and Hf-C-N", Journal of Alloys and Compounds, vol. 217, pp. 128-136, 1995.

Ono et al., "High Temperature Synthesis of (Ti, W) (C, N) Carbonitrides", J. Japan Inst. Metals, vol. 53, No. 12, pp. 1242-1247, 1989.

PCT International Search Report dated Sep. 21, 2010 and Written Opinion.

\* cited by examiner ent of the present invention;
THERMO-OPTICALLY FUNCTIONAL COMPOSITIONS, SYSTEMS AND METHODS OF MAKING

BACKGROUND

The presently claimed invention relates generally to thermo-optically functional materials and related methods and systems.

Materials with suitable emission or reflection spectra find use in varied applications. For example, emissive materials can be used in light sources such as incandescent lamps and reflective materials can be used in thermal management systems.

Therefore, it would be advantageous to develop materials with tailored thermo-optical properties.

BRIEF DESCRIPTION

In accordance with one aspect of the disclosure, a thermo-optically functional composition is disclosed. The composition includes a solid solution of at least two materials selected such that the composition emits thermal radiation, wherein each material is selected from the group consisting of metal carbides, metal nitrides, metal oxides, metal borides, metal silicides and combinations thereof, wherein each metal is selected from the group consisting of tungsten or tungsten alloys, hafnium or hafnium alloys, niobium or niobium alloys, tantalum or tantalum alloys, titanium or titanium alloys, zirconium or zirconium alloys, and combinations of two or more thereof, with the proviso that when carbon or nitrogen is present in the composition, the composition comprises at least two non-metals.

In accordance with another aspect of the disclosure, a radiation emitter is described. The radiation emitter is configured to emit thermal radiation and includes a composition including a solid solution of at least two materials selected such that the composition emits thermal radiation, wherein each material is selected from the group consisting of metal carbides, metal nitrides, metal oxides, metal borides, metal silicides and combinations thereof, wherein each metal is selected from the group consisting of tungsten or tungsten alloys, hafnium or hafnium alloys, niobium or niobium alloys, tantalum or tantalum alloys, titanium or titanium alloys, zirconium or zirconium alloys, and combinations of two or more thereof, with the proviso that when carbon or nitrogen is present in the composition, the composition comprises at least two non-metals.

In accordance with a further aspect of the disclosure, a radiation source is disclosed. The radiation source includes a base, a light transmissive envelope coupled to the base and a composition including a solid solution of at least two materials selected such that the composition emits thermal radiation, wherein each material is selected from the group consisting of metal carbides, metal nitrides, metal oxides, metal borides, metal silicides and combinations thereof, wherein each metal is selected from the group consisting of tungsten or tungsten alloys, hafnium or hafnium alloys, niobium or niobium alloys, tantalum or tantalum alloys, titanium or titanium alloys, zirconium or zirconium alloys, and combinations of two or more thereof, with the proviso that when carbon or nitrogen is present in the composition, the composition comprises at least two non-metals.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
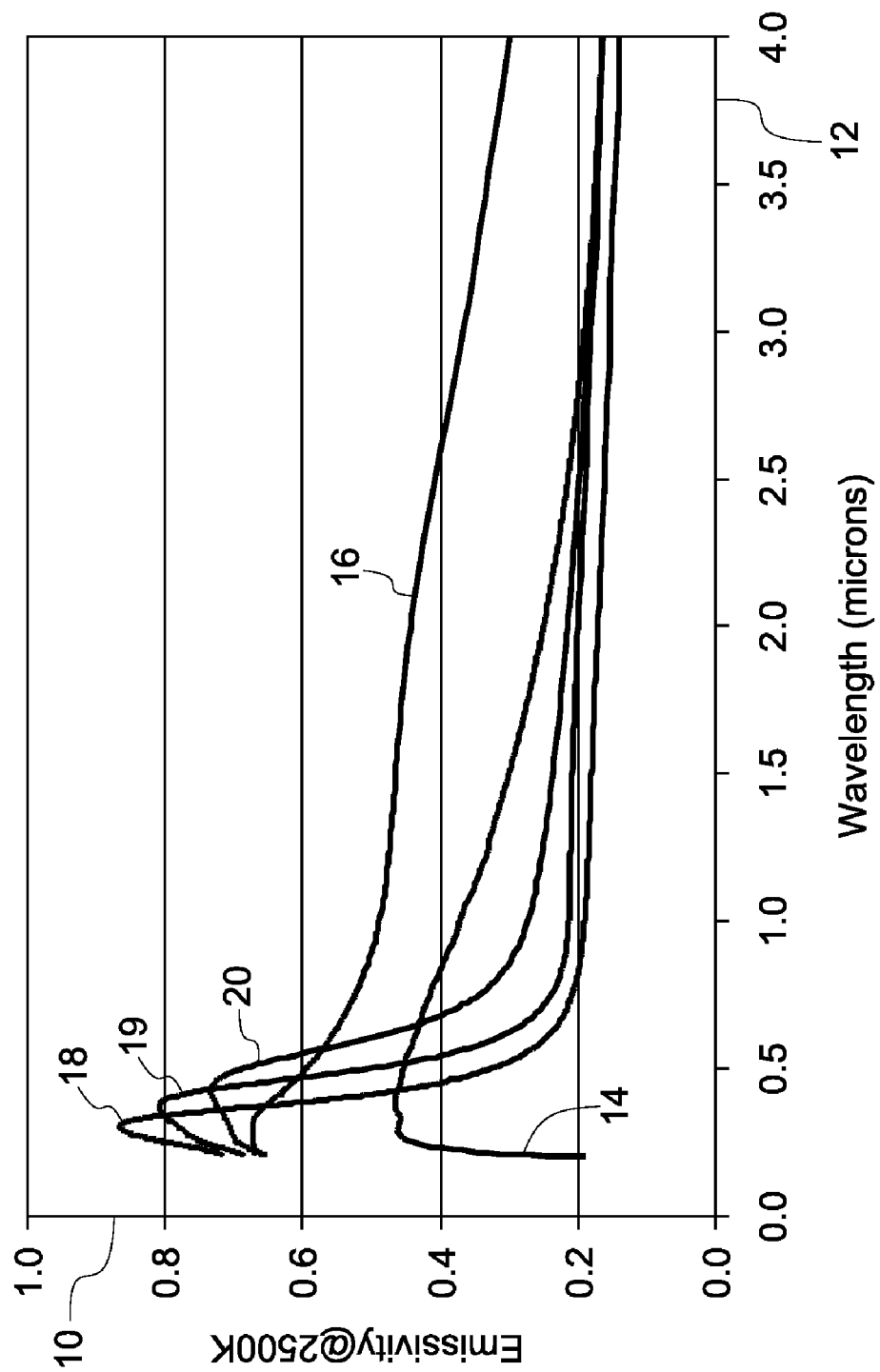
FIG. 1 is a comparative illustration of theoretically estimated emissivity versus wavelength plots for tungsten, hafnium nitride, hafnium carbide and hafnium carbonitrides of various stoichiometry, in accordance with one embodiment of the present invention.

In accordance with one or more embodiments of the presently claimed invention, compositions, radiation emitters, radiation sources, and associated methods will be described herein. In the following description, numerous specific details are set forth in order to provide a thorough understanding of various embodiments of the present invention. However, those skilled in the art will understand that embodiments of the present invention may be practiced without these specific details, that the present invention is not limited to the depicted embodiments, and that the present invention may be practiced in a variety of alternative embodiments. In other instances, well known methods, procedures, and components have not been described in detail.

Furthermore, various operations may be described as multiple discrete steps performed in a manner that is helpful for understanding embodiments of the present invention. However, the order of description should not be construed so as to imply that these operations need be performed in the order they are presented, or that they are even order dependent. Moreover, repeated usage of the phrase "in one embodiment" does not necessarily refer to the same embodiment, although it may. Lastly, the terms "comprising", "including", "having", and the like, as used in the present application, are intended to be synonymous and interpreted as open ended unless otherwise indicated.

Various embodiments of thermo-optically functional compositions (also referred to as "composition" or "compositions"), systems and methods of making the same are described herein. The compositions may include a number of material components that together have a thermal emission or reflection spectrum that is different from that of the constituent components or combinations of such components. In more specific embodiments, the compositions may be in the form of a solid solution or may form a single or multi-phase material. The compositions may be utilized in a wide variety of thermal and optical applications and may be employed in a variety of physical or structural articles or systems. In various embodiments, the compositions may be used in connection with a luminous element or radiation source in lighting applications.

In one embodiment, a thermo-optically functional composition may include components A, B, C, and D, and have a thermal emission or reflection spectrum that is altered with respect to a thermal emission or reflection spectrum of a composition $AB_n$ and a thermal emission or reflection spectrum of a composition $CD_p$. $AB_n$ is a normalized representation, where the composition is normalized to the molar percent of A. Similarly, $CD_p$ is a normalized representation, where the composition is normalized to molar percent of C present. For example, if $AB_n$ or $CD_p$ is a stoichiometric hafnium carbide composition, then hafnium carbide is represented as HfC, where n (or p) is 1.

In some embodiments of the composition, component A is different from component C or component B is different from component D, or both component A is different from component C and component B is different from component D. In one embodiment, components A and C may be identical to each other, while components B and D are different from one another. For example, a thermo-optically functional hafnium carbonitride composition may include hafnium as both component A and component C, and carbon and nitrogen as component B and component D respectively.

In one embodiment, if A and C consist of hafnium and tantalum respectively, and B and D consist of nitrogen, the composition further comprises another metal or non-metal E. In another embodiment, if B and D consist of carbon, the composition further comprises another non-metal E.

In one example, ab-initio calculations were performed to determine the variation in emissivity with temperature and wavelength for hafnium nitride, hafnium carbide and hafnium carbonitrides of various stoichiometries. FIG. 1 illustrates the variation in emissivity (Y-axis 10) with wavelength (X-axis 12) for the illustrated materials. Spectral plots 14, 16, 18, 19 and 20 illustrate the variation in theoretically calculated emissivity with wavelength at a temperature of 2500 degrees Kelvin for tungsten, hafnium carbide, hafnium nitride, and two different hafnium carbonitride compositions respectively. Both tungsten and hafnium carbide exhibit broad spectral emission with substantial emission occurring in the infrared wavelengths. The hafnium nitride emissivity peaks in the ultra violet region close to the start of the visible region, and exhibits a very narrow spectrum peaking below well below 500 nanometers before quickly dropping off. Spectral plots 19 and 20 show the theoretically calculated emissivities for hafnium carbonitride compositions $HfC_{0.25}N_{0.75}$ and $HfC_{0.5}N_{0.5}$. For the hafnium carbonitride compositions, not only does the emission spectrum exhibit a broad peak in the visible region (about 380 to about 760 nanometers) of the electromagnetic radiation spectrum, but the emissivity is also higher in the visible region as compared to tungsten. The emissivity also tends to be lower than tungsten in the infrared region.

Although the Applicants do not wish to be bound by any particular theory, it is currently believed that thermo-optical properties of tertiary and higher order compounds, such as $HfC_xN_y$, may be strong functions of the composition and stoichiometry. The position of the maximum may be defined by plasma frequency of the material and intraband absorption transitions. Substitution of a nitrogen atom with a carbon atom in hafnium nitride (HfN->$HfC_xN_y$) is expected to result in lower plasma frequency for $HfC_xN_y$ compound. The Carbon atom is expected to also introduce extra intraband transitions in the visible. As a cumulative result of the nitrogen replacement, emission maximum will broaden and shift towards lower energy part of the spectrum.

In an alternative embodiment, component A and component C may differ, while component B and component D are identical. For example, this may be illustrated by a titanium hafnium nitride composition including titanium and hafnium as components A and C respectively, and nitrogen as both components B and D. In another embodiment, components A, B, C and D are all different such as in a titanium hafnium carbonitride composition.

In a further embodiment, the components A and C may each be metal components, while B and D may each be non-metal components. In one example, A and C may be identical metal components, while B and D may be non-metal components that differ from each other. In another example, B and D may be identical non-metal components, while A and C may be metal components that differ from each other.

The composition may also include additional metal or non-metal components, in addition to components A, B, C, and D. The additional components may or may not alter the emission or reflection spectrum of the composition.

A metal component may include one or more metals, alloys of metals and combinations of metals. A non-metal component may include one or more non-metals, or combinations of non-metals. In one embodiment, the composition includes at least two different non-metals.

In one embodiment, components A and C may each include a metal component selected from the group consisting of transition metals, alloys of two or more transition metals and combinations of two or more transition metals. In a further embodiment, components A and C may each include a metal component selected from the group consisting of tungsten, hafnium, niobium, tantalum, titanium, zirconium, alloys of two or more thereof, and combinations of two or more thereof.

In one embodiment, components B and D may each include a non-metal component selected from the group consisting of nitrogen, carbon, oxygen, boron, silicon and combinations of two or more thereof.

In one embodiment, the composition may be a mixture or blend of $AB_n$ and $CD_p$. In another embodiment, the composition is a compound. In a further embodiment, one or more components of the composition may be dissolved in a compound formed by other constituents of the composition. For example, component C, component D, or both components C and D may be dissolved in $AB_n$.

In one embodiment, the composition may include a solid solution of formula $(A_{1-z}C_z)(B_xD_y)_m$, where the formula is normalized to molar percent of A and C present, where z may vary from 0 to 1.

In one embodiment, xm may be in a range from 0 to about 1. In a more specific embodiment, xm may be in a range from about 0.05 to about 0.70. In one embodiment, ym may be in a range from about 0 to about 1. In a further embodiment, ym may be in a range from about 0.05 to about 0.7 Varying the composition and/or the stoichiometry of the composition may vary an emission or reflection spectrum of the composition. For example, z, xm and ym may be varied to vary an emission or reflection spectrum of the composition depending upon the desired application.

In accordance with a further aspect of the present invention, the thermo-optically functional composition may include a metal component and a non-metal component. In one embodiment, the metal component may include one or more metals and, the non-metal component may include two or more non-metals. In one embodiment, the emission spectrum or reflection spectrum of such a composition is different from an emission spectrum or a reflection spectrum of the one or more metals, the two or more non-metals, or any combinations of the metals and non-metals thereof when taken separately from the composition. In a non-limiting example, the composition may include a metal, such as hafnium, and two non-metals, such as carbon and nitrogen, to form hafnium carbonitride. In another non-limiting example, the composition may include a first metal, such as hafnium, a second metal, such as titanium, and a first non-metal, such as nitrogen, and a second non-metal such as carbon to form titanium hafnium carbonitride.

In one embodiment, when the non-metal component consists of nitrogen and the metal component comprises hafnium and tantalum, then at least a third metal is present in the composition.

In one embodiment, the non-metal component may be selected from the group consisting of nitrogen, carbon, oxygen, boron, silicon and combinations of two or more thereof.

The metal component, for example, may include at least one material selected from the group consisting of transition metals, alloys of transition metals and combinations of two or more transition metals. Non-limiting examples of transition metal based materials include tungsten or tungsten alloys, hafnium or hafnium alloys, niobium or niobium alloys, tantalum or tantalum alloys, titanium or titanium alloys, zirconium or zirconium alloys, and combinations of two or more thereof.

In various embodiments described herein, an emission or reflection spectrum of the composition may be different from an emission spectrum or a reflection spectrum of its constituent materials or combinations of the constituent materials, at a temperature above room temperature. In a further embodiment, the emission spectrum or a reflection spectrum of the composition is different at a temperature above 600 degrees Kelvin. In a still further embodiment, the emission spectrum or a reflection spectrum of the composition is different at a temperature greater than 2000 degrees Kelvin.

In certain embodiments, each of the compositions described herein may include a solid solution. In accordance with another aspect of the present invention, a thermo-optically functional composition including a solid solution of at least two materials selected such that the composition emits thermal radiation is disclosed. Each material is selected from the group consisting of metals, metal carbides, metal nitrides, metal oxides, metal borides, metal silicides and combinations thereof, and where each metal is selected from the group consisting of tungsten or tungsten alloys, hafnium or hafnium alloys, niobium or niobium alloys, tantalum or tantalum alloys, titanium or titanium alloys, zirconium or zirconium alloys, and combinations of two or more thereof. In one embodiment, when a metal carbide or metal nitride is present, the composition includes at least two non-metals. In one embodiment, when carbon or nitrogen is present in the composition, the composition comprises at least two non-metals.

As used herein, the term "solid solution" refers to a solid-state solution of one or more solutes in a solvent. Such a mixture is considered a solution rather than a compound when the crystal structure of the solvent remains unchanged by addition of the solutes, and when the mixture remains in a single homogeneous phase. The solute may incorporate into the solvent crystal lattice substitutionally, by replacing a solvent particle in the lattice, or interstitially, by fitting into the space between solvent particles. Both of these types of solid solution affect the properties of the material by distorting the crystal lattice and disrupting the physical and electrical homogeneity of the solvent material.

In a non-limiting example, the composition may be a solid solution of hafnium nitride and titanium nitride to form a titanium hafnium nitride composition. In one embodiment, the emission or reflection spectrum of the titanium hafnium nitride solid solution is altered from an emission or reflection spectrum of hafnium nitride and titanium nitride.

In another non-limiting example, the composition may be a solid solution of hafnium carbide and hafnium nitride (to form a hafnium carbonitride composition). In one embodiment, the emission or reflection spectrum of the hafnium carbonitride solution is altered from an emission or reflection spectrum of hafnium carbide and hafnium nitride.

In certain embodiments, the thermo-optically functional compositions described herein may be stoichiometric compositions. In other embodiments, the compositions may be off-stoichiometric compositions. In one example, an off-stoichiometric composition may be a sub-stoichiometric composition. Non-limiting examples of off-stoichiometric compositions include $HfN_{0.71}C_{0.09}$, $HfN_{0.70}C_{0.09}$, $HfN_{0.67}C_{0.25}$, and $HfN_{0.69}C_{0.15}$.

The solid solution hafnium carbonitride may be represented by formula $(H(C_xN_y)_m)$. In one embodiment, xm may be in a range from 0 to about 1. In a further embodiment, xm may be in a range from about 0.05 to about 0.7. In one embodiment, where ym may be in a range from about 0 to about 1. In one embodiment, ym may be in a range from about 0.05 to about 0.07. In one embodiment, an emission or reflection spectrum of the composition may vary with variation in xm and ym.

The solid solutions described herein may also include solid solutions of a metal and a compound of the same metal. For example, the solid solution of hafnium and hafnium nitride, may form a sub-stoichiometric hafnium nitride composition, for example a composition which may be represented as $HfN_x$, where $x<1$.

In one embodiment, the composition includes a solid solution of a metal carbide and a metal nitride. Examples of metal carbides include metal oxycarbides. Examples of metal nitrides include metal oxynitrides. Examples of metal carbonitrides include metal oxycarbonitrides.

In some embodiments, the thermo-optically functional compositions described herein may be single phase compositions. In some alternate embodiments, the thermo-optically functional materials may be multiple-phase materials.

In certain embodiments, the compositions may be porous. Porosity may exist at the atomistic level or the microstructural level. In some embodiments, the compositions may include atom vacancies. The vacancies may be present periodically in the composition or may be present in a random manner. In a non-limiting example, the microstructural porosity may form a second phase in the composition and may be either isolated or continuous.

In one embodiment, the compositions may be configured for radiation emission dominantly at wavelengths in a range from about 300 nanometers to about 15000 nanometers. In a further embodiment, the composition may be configured for radiation emission dominantly at wavelengths in a range from about 400 nanometers to about 700 nanometers. In yet a further embodiment, the composition may be configured for radiation emission dominantly at wavelengths in a range from about 700 nanometers to about 15000 nanometers.

The compositions of the various embodiments described herein may exhibit tailored reflection spectrum. In one embodiment, the composition may be configured to reflect incident light predominantly at wavelengths in the infrared region of the electromagnetic spectrum. For example, the composition may be configured to predominantly reflect wavelengths greater than about 700 nanometers.

The reflective properties of these compositions may enable their use in systems requiring thermal management. The constituents and form of the compositions may be varied to produce a desirable reflection spectrum. In particular, the compositions may find use in systems where radiation control and thermal balance is desirable. Non-limiting examples of applications include in reflectors, lasers, photovoltaic devices, ovens, and systems where infrared signature is required to be modified or altered.

In one embodiment, the composition may have a melting point in a range from about 600 degrees Kelvin to about 2000 degrees Kelvin. In another embodiment, the composition may have a melting point greater than 2000 degrees Kelvin. In a further embodiment, the composition may have a melting point greater than 2200 degrees Kelvin.

The thermo-optically functional compositions described herein may be employed as luminous emissive or reflective elements. FIGS. 2-15 are illustrative examples of emissive or reflective elements in accordance with various embodiments of the present invention.

Figure 2:
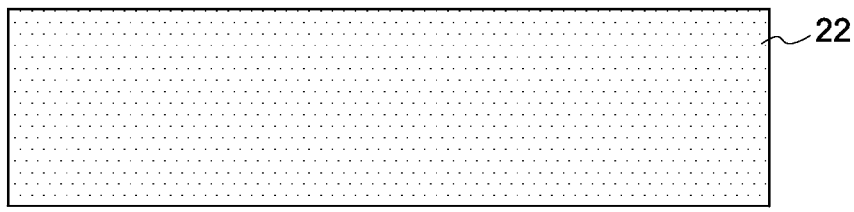
FIGS. 2-10 illustrate examples of thermo-optically emissive or reflective elements in accordance with one embodiment of the present invention.
Figure 3:
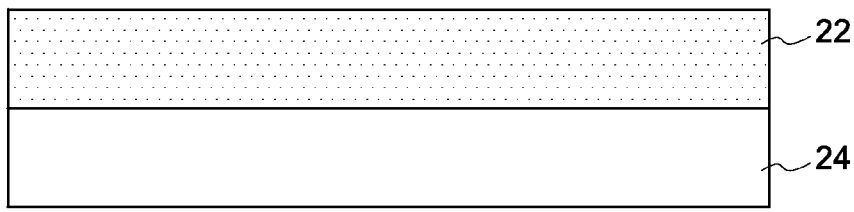

As illustrated in FIG. 2, the luminous emissive or reflective element may be a unitary structure 22 of the composition. Alternatively, the luminous emissive or reflective element may further include a substrate 24 as shown in FIG. 3. In one embodiment, the thermo-optically functional composition may be present as a coating over the substrate 24. The coating thickness may range from a few nanometers to a several microns. In one embodiment, the coating thickness may range from about 500 nanometers to about 10 microns.

Figure 4:

In the embodiment illustrated in FIG. 4, the composition is disposed as a coating 22 on both sides of the substrate 24. Substrate materials for example may include materials such as refractory metals ceramics and metal-ceramic composites. Non-limiting examples of substrate materials include but are not limited to tungsten, molybdenum, niobium, zirconium, tantalum, osmium, rhenium, carbon, nitrides and carbides.

Figure 5:
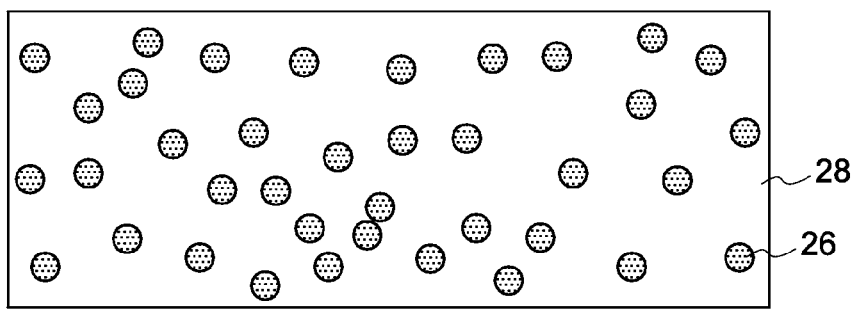

As illustrated in the embodiment of FIG. 5, the luminous emissive or reflective element may include a composition 26 embedded in the substrate 28. In some embodiments, the composition may be incorporated as a second phase into the substrate.

Figure 6:
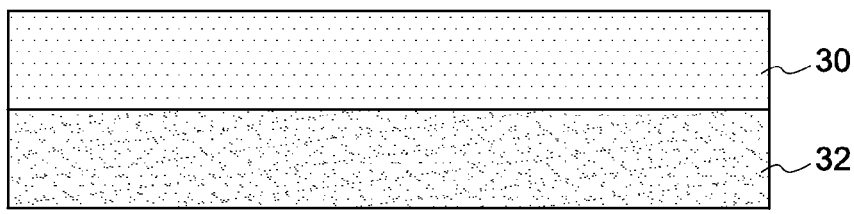

FIG. 6 illustrates a luminous emissive or reflective element having a composition that includes two layers of different compositions. For example layers 30 and 32 may represent $AB_n$ and $CD_p$, respectively. During thermal energization, $AB_n$ and $CD_p$, present in the two layers, may intersperse to form a thermo-optically functional composition as described herein.

Figure 7:
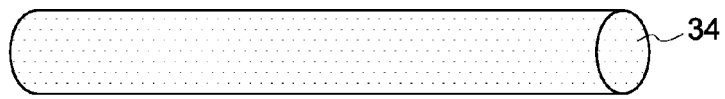
Figure 8:
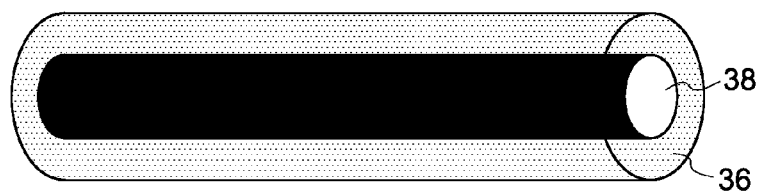

In one embodiment, the luminous emissive or reflective element may comprise a rod-like structure 34 as shown in FIG. 7. Alternatively, as illustrated in FIG. 8, the element may comprise a rod-like substrate 38 and the composition 36 present as a coating over the substrate.

Figures 9, 10:
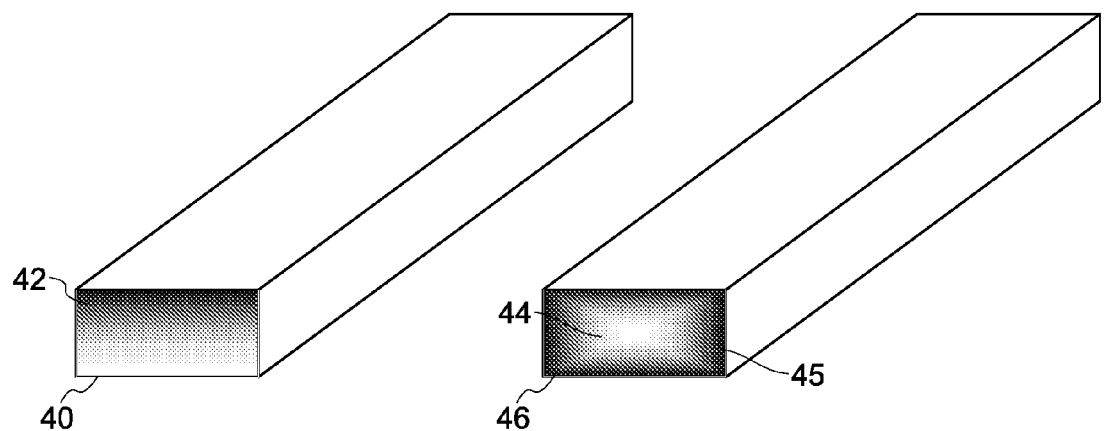

In some embodiments of the luminous emissive or reflective elements, the elements may include compositions that are graded compositions, in which the concentration of various components in the composition may vary through the composition. For example, if the emissive or reflective element includes a graded composition of hafnium carbonitride $H(C_{x^-} N_y)_m$, then x, y, and m may vary through the element. Non-limiting examples of graded compositions are illustrated in FIGS. 9 and 10. In FIG. 9, the concentration is shown to vary through the thickness of the element from bottom edge 40 to top edge 42 of the luminous element. In the example of FIG. 10, the gradation is shown to be from center out. More specifically, in FIG. 10, the concentration is shown to vary from the center 44 to edges 45 and 46 of the element.

In one embodiment, the luminous emissive or reflective elements may be operated at a temperature above room temperature. In a further embodiment, the luminous element may be operated at a temperature above 600 degrees Kelvin. In a still further embodiment, the luminous element may be operated at a temperature greater than 2000 degrees Kelvin.

In accordance with another aspect of the present invention, the thermo-optically functional compositions described herein may be employed as luminous emissive or reflective elements in a radiation emitter. A non-limiting example of a radiation emitter includes a filament such as used in a light source or lamp. In one embodiment the thermo-optically functional compositions described herein may be employed as luminous emissive or reflective elements in an incandescent lamp. In one embodiment, the radiation emitter may include electrical leads to supply electrical energy to the luminous element. The luminous element and the electrical leads may form a unitary structure or the electrical leads may be separately manufactured.

The radiation emitter may further include a transmissive protective coating disposed over the luminous element, to protect a luminous surface and to allow the radiation emitted by the emitter to be transmitted. In a non-limiting example, the transmissive coating material may comprise thin layers. For example, the transmissive coating material may comprise a few nanometers of refractory materials or ceramic materials.

Figure 11:
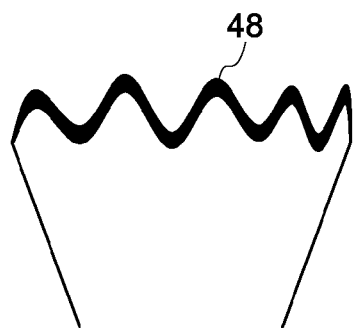
FIG. 11-15 illustrate examples of emitter filaments in accordance with one embodiment of the present invention.
Figure 12:
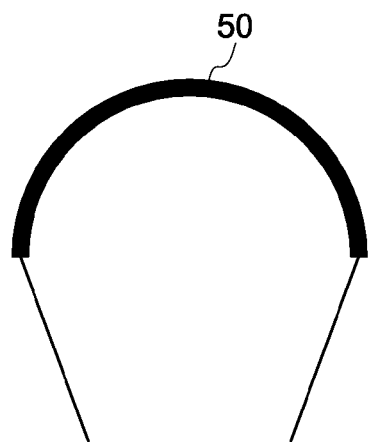
Figure 13:
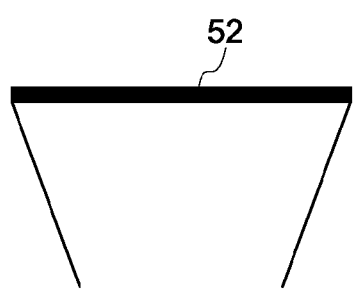
Figure 14:
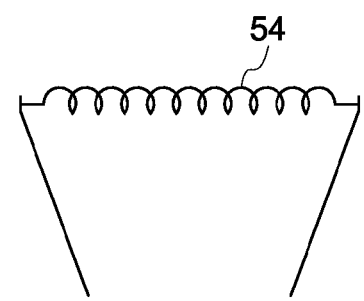
Figure 15:
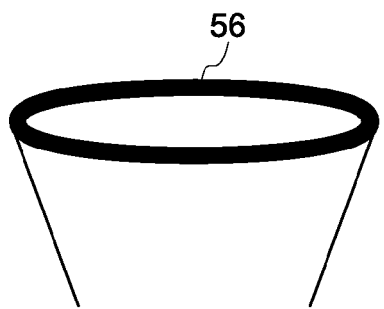

The luminous element in a radiation emitter may be formed in various shapes and structures. Examples of various luminous element structures are illustrated in FIGS. 11 though 15. The luminous element structures depicted in FIGS. 11 through 15 are intended to be illustrative and not limiting. In one example, the luminous element may be a planar ribbon element 48 as shown in FIG. 11. The luminous element of FIG. 12 is a curved element 50. In another example, the luminous element may be a planar structure 52 as shown in FIG. 13. The luminous element illustrated in FIG. 14 represents a coiled element 54 which may be formed in a coiled-coil arrangement. In an alternate example, the luminous element may be a planar annular element 56 as shown in FIG. 15.

The luminous elements described herein may find further use in various radiation sources. In one embodiment, a radiation source may include a base, a light-transmissive envelope coupled to the base, and a radiation emitter including at least one thermo-optically functional composition described herein disposed within the light-transmissive envelope.

Figure 16:
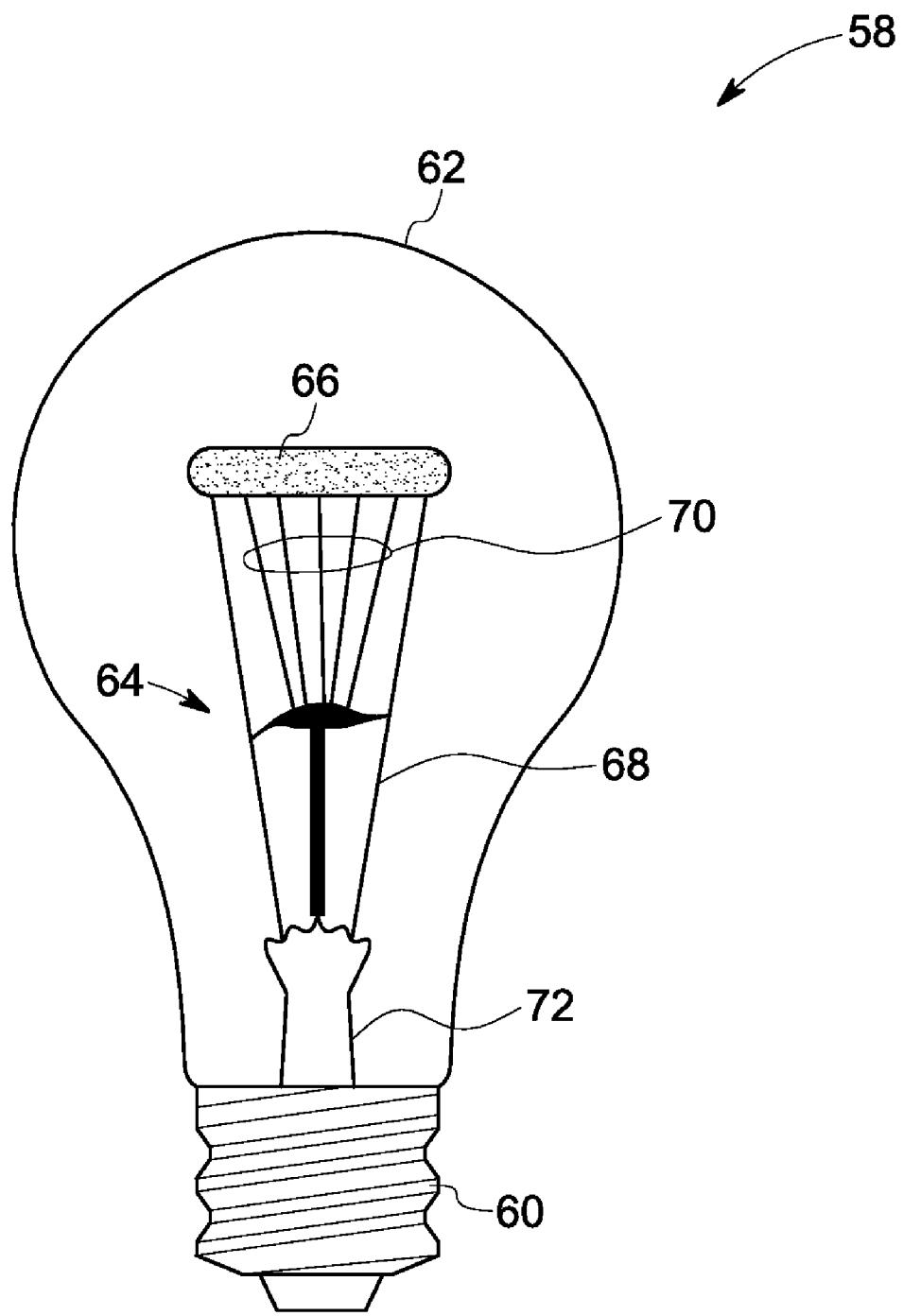
FIG. 16 illustrates an incandescent lamp in accordance with one embodiment of the present invention.

FIG. 16 illustrates a radiation source such as an incandescent lamp including the radiation emitter in accordance with one embodiment of the present invention. As illustrated in FIG. 16, incandescent lamp 58 may include a base 60, a light-transmissive envelope 62 coupled to the base 60, and the radiation emitter 64 including the luminous element 66 coupled to the base 60. The base 60 is where the electrical contact for the lamp is made and as such, may be fabricated out of any conductive material such as brass or aluminum. The light-transmissive envelope 62 may be fabricated out of glass and may take on any of a wide variety of shapes and finishes.

The radiation emitter 64 may be coupled to the base and may include lead wires 68, support wires 70, and a stem press 72. The lead wires 68 carry the current from the base 60 to the luminous element 66. The lead wires 68 may be made of copper from the base 60 to the stem press 72 and may be made of nickel or nickel-plated copper from the stem press 72 to the luminous element 66. The stem press 72 may be a glass-based structure that holds the radiation emitter 64 in place. The stem press 72 may include an airtight seal around the lead wires 68. In order to balance the coefficients of expansion, the stem press 72 may further include a copper sleeve through which the lead wires 68 are passed. The support wires 70 are used to support the luminous element 66 and may be made from molybdenum, for example.

Figure 17:
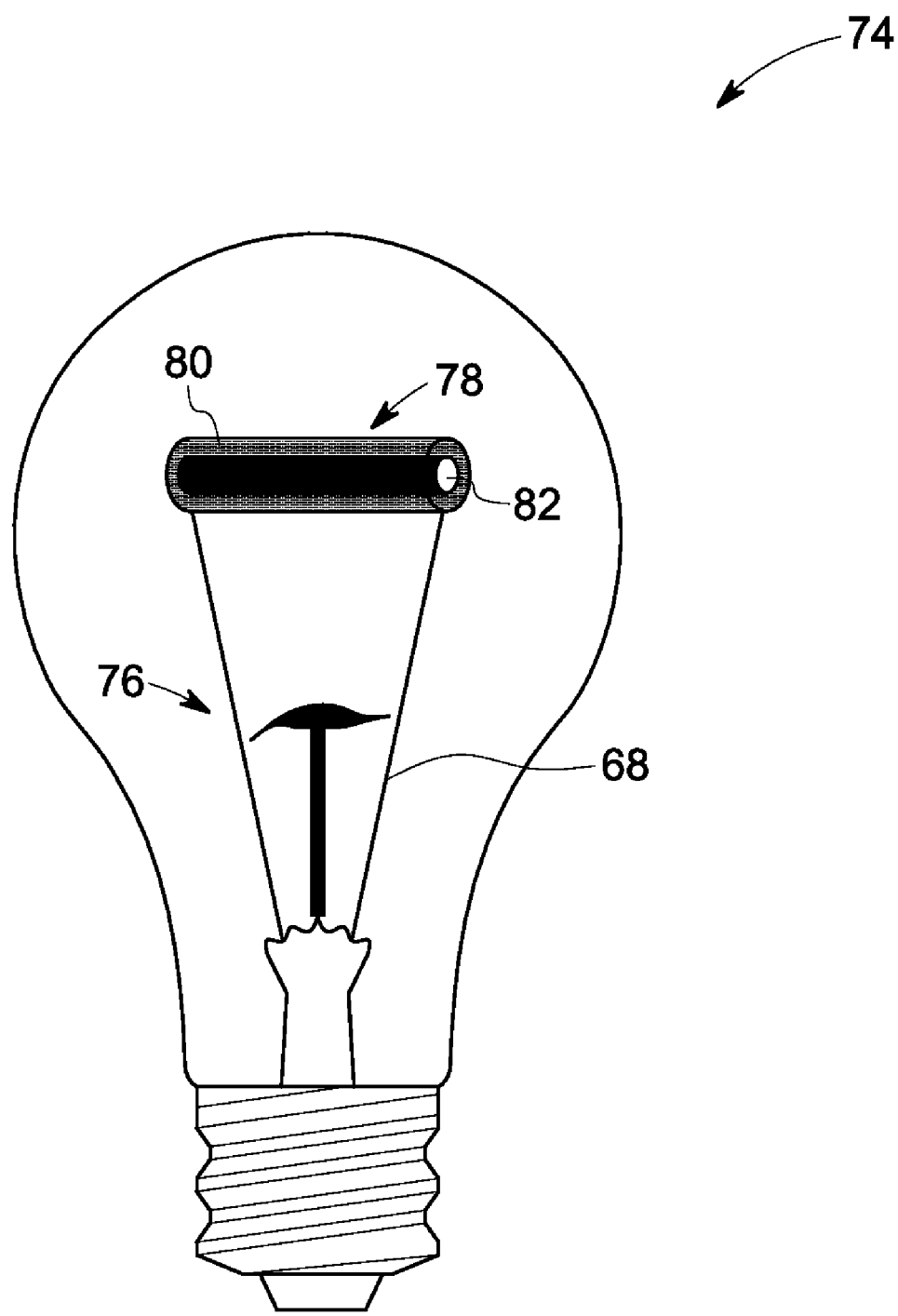
FIG. 17 illustrates an alternate incandescent lamp in accordance with one embodiment of the present invention.

In the embodiment illustrated in FIG. 17, the incandescent lamp 74 is substantially similar to the incandescent lamp 58 of FIG. 16. However, the radiation emitter 76 of the incandescent lamp 74 includes a luminous element 78 that in turn includes an emitter 80 comprising the composition disposed over a substrate or core 82. Luminous elements may have various structures as described above. For example, the luminous element may be a coiled element or a planar element. In one non-limiting example, the element may be a double-coiled element including substrate 82 with the coating 80. In another non-limiting example, the composition may form an emitter 80 with no direct electrical contact with the core 82 forming a filament. The emitter may be mechanically supported by the core 82 but not electrically connected to it. The emitter may therefore be indirectly heated by the radiation from the core 82 to in turn emit radiation.

In a further embodiment, a gas filling may be disposed within the light transmissive envelope. Non-limiting examples of such gas fillings include noble gases such as but not limited to argon, krypton and gases such as nitrogen. In one example the gas filling may include 95% argon and 5% nitrogen.

In one embodiment, the gas filling may be chosen to be non-reactive to the luminous element material. In an alternative embodiment, the gas filling may be chosen, such that thermodynamic equilibrium is achieved during operation between the gas filling and the material of the luminous element. In another alternative embodiment a gas fill is chosen so as to maintain a constant composition at the emitter surface at the temperature of operation, for example at 2000 degrees Kelvin.

The emission quality of radiation sources may be characterized by parameters such as color rendition index (CRI) and color temperature. CRI is a measure of the ability of a light source to reproduce the colors of various objects being lit by the source. In various embodiments including the compositions described herein, the color rendition index (CRI) of the radiation source is typically in a range from about 60 to about 100. In some embodiments, the CRI is in a range greater than 75. In more specific embodiments, the CRI is greater than 90.

Color temperature of a radiation source is determined by comparing the color of the source with a theoretical, heated black-body radiator. In some embodiments, the color temperature of the radiation sources is greater than about 2000 degrees Kelvin. In some further embodiments, the color temperature of the radiation sources is greater than 2500 degrees Kelvin.

In accordance with a further aspect of the present invention, various exemplary methods for forming the thermo-optically functional compositions described herein are provided. In one embodiment, such compositions may be formed by preparing mixtures on a substrate. In a non-limiting example, a 100-nanometer layer of hafnium carbide may be sputtered onto a tungsten substrate. This may be followed by sputtering 900 nm of hafnium nitride over the hafnium carbide layer. Alternatively, a layer of hafnium nitride may be first sputtered on to the substrate followed by sputtering a layer of hafnium carbide over the hafnium nitride layer. Subsequent heating of the tungsten substrate, such as might occur when used as a lamp filament, results in interdiffusion of the carbon and nitrogen to produce the desired composition. Temperatures as low as 1800 degrees Kelvin have been used successfully for interdiffusion. At approximately 2000 degrees Kelvin, the interdiffusion may occur in a matter of minutes. By changing the ratio of hafnium carbide to hafnium nitride the overall composition stoichiometry and consequently the emission or reflection spectrum may be varied as desired.

In a further embodiment, multiple layers of hafnium carbide and hafnium nitride of may be used to reduce the diffusion time. In a non-limiting example, the above sequence of composition formation may be altered. For example, a 50 nanometer layer hafnium carbide followed by a 450 nanometer layer hafnium nitride, followed again by a 50 nanometer layer hafnium carbide and a 450 nanometer hafnium nitride may be formed. Such sequences can be used to produce greater or lesser thicknesses of the hafnium carbide and hafnium nitride layers as needed. Ternary, quaternary and higher compounds and mixtures may be formed in this manner.

In another embodiment, the compositions may be formed by co-sintering a powdered mixture which may then be sputtered on to a substrate. In a non-limiting example, to produce $HfC_{0.1}N_{0.90}$, a mixture of powders HfN (90 mol %) and HfC (10 mol %) may be pressed and sintered to fabricate a sputter target. The target may be used to directly deposit the coating of the desired composition onto a filament material such as tungsten. Some allowance in the target composition may be necessary for a drift in composition during sputtering. This process may be used for any combination of materials, which can be co-sintered or formed into a dense self-supporting compact.

In yet another embodiment, the compositions may be formed by direct or reactive sputtering. Direct sputtering transfers the target composition substantially to the substrate. Reactive sputtering alters the composition of the target material during the transfer. Hafnium from a hafnium metal target may be reacted with nitrogen in the sputtering chamber to from hafnium nitride as a deposit. The same processes may be applied to oxides, carbides and nitrides.

In still another embodiment, a combination of sputtering and chemical vapor deposition (CVD) may be used to form the composition. In a non-limiting example, a 100 nanometer hafnium carbide layer may be deposited by sputtering and a 900 nm hafnium nitride layer may then be deposited by chemical vapor deposition. This may be followed by techniques to interdiffuse the materials in the two layers to produce the desired composition. Combinations of sputter and CVD and other layer fabrication methods may be used as dictated by manufacture or material specific properties such as ease of deposition.

In another embodiment of the present invention, a substrate such as one made of tungsten may be carburized. Such carborization may be performed by treatment of the substrate at elevated temperatures, greater than about 1000 degrees Kelvin, with a carbon containing gas such as carbon monoxide or methane. The amount of carbon in the tungsten may be controlled by the time and temperature of carburization. Hafnium nitride may then be deposited onto the carburized filament. To form the desired composition, carbon is diffused from the filament into the hafnium nitride either during the hafnium nitride deposition, or during a subsequent heat treatment or during self-heating of the substrate. Nitrogen may be similarly added to hafnium carbide.

In yet another embodiment, one component such as hafnium nitride may be used in the solid state, and a second component obtained from a gas used in the environment of operation. In a non-limiting example, a hafnium nitride coated filament may be reheated in the presence of a carburizing gas to impart the desired composition. The gas can be, for example, carbon monoxide or methane. Choice of gas as well as the time and temperature of reaction in the carburizing gas typically determine the amount of carbon incorporated into the hafnium nitride coating. Homogeneity of the carbon distribution may be achieved by heat treatment in an inert atmosphere or vacuum.

In another embodiment of the present invention, a metal may be nitrided and carburized by gases. For example, a desired metal such as hafnium can be deposited onto a filament surface by any applicable physical or mechanical technique such as sputtering. The desired carbonitride composition may be imparted by treatment at elevated temperature in carburizing or nitriding gases. Carburizing and nitriding can occur simultaneously or in any sequence. Either reaction may be used exclusively. Examples of nitriding gases include but are not limited to nitrogen and ammonia. The metal can be any of the desired metals, such as hafnium, zirconium, tantalum, titanium, molybdenum, niobium or combinations of metals. In one embodiment, the metal may be at least part of a surface alloy of the filament and may include solid solutions, compounds and mixtures. The entire filament may be the desired alloy.

Should any of the processing steps leave the constituents intermixed in such a manner that is undesirable for the intended purpose and which could be improved by subsequent heat treatment, such heat treatment may be accomplished as a separate step in the appropriate atmosphere or during testing or use of the substrate.

In one embodiment, the composition may include microstructural features such as impurities, porosity, compositional gradients and grain size variations. Such microstructural features are often the normal consequence of processing and may be tolerated over a wide range for many applications. Impurities of oxygen and zirconium up to several mol % each may be present in hafnium carbonitride without affecting the function or performance of the composition. Porosity of up to about 5 volume % has been noted in hafnium nitride compounds with no noted affect on properties. The grain size of hafnium nitride compounds may range from about 100 nanometers to 100 microns with no noted affect on properties. If gradients need to be eliminated near the functional surface, these may be eliminated by heat treatments as discussed previously or by controlling the environment.

In one embodiment the composition may be reactive to the substrate or filament it may be disposed over. The substrate or filament should be chosen to minimize interaction with the coating, which may result in significant change to coating composition during coating life. Interactions may include chemical reaction and interdiffusion. Thermal expansion differences may limit the combinations of coating and substrate that may be used. A large mismatch may lead to spalling of the coating. Thin coatings are less susceptible to problems resulting from thermal expansion differences.

In one embodiment the composition may be reactive to the environment it is present in. Evaporation, decomposition, and chemical reaction between a coating of the composition and the environment may result at high temperatures. These interactions may be minimized by the appropriate choice of environment. In one embodiment, composition may be either inert to the environment or near to thermodynamic equilibrium with it. The environment may produce minimal changes to the coating, keeping it within the compositional limits for the desired function. The environment may be intentionally chosen, for example in a hafnium carbonitride containing composition, by adding gaseous species which control the carbon, nitrogen and oxygen chemical potential within it.

Without further elaboration, it is believed that one skilled in the art can, using the description herein, utilize the present invention to its fullest extent. The following examples are included to provide additional guidance to those skilled in the art in practicing the claimed invention. The examples provided are merely representative of the work that contributes to the teaching of the present application. Accordingly, these examples are not intended to limit the invention, as defined in the appended claims, in any manner.

EXAMPLES

The samples described in the following examples typically comprise a tungsten strip and an emissive coating deposited on one side of the strip. Samples are mounted in a vacuum chamber using incandescent filament stems. The chamber is evacuated down to approximately $10^{-7}$ Torr and back filled with 1000 Torr of extra pure nitrogen. Strips are resistively heated to about 2273 degree Kelvin. Temperature ($T_{calib}$) is measured using a dual wavelength pyrometer focused on the tungsten side of the sample. Emission signal ($S_{sample}$) from the coated side of the strip is recorded. The sample is rotated 180 degrees and emission from the tungsten side ($S_{calib}$) is recorded as a calibration reference. Emissivity of the coating ($\epsilon(\lambda, T_{calib})$) at a given wavelength is found using equation (1) assuming that in case of a thin coating, temperatures of the front and back side of the sample are equal.

$$\varepsilon(\lambda, Tcalib) = \varepsilon_W(\lambda, Tcalib) \cdot \frac{Ssample}{Scalib}. \quad (1)$$

Emissivity of tungsten at a given wavelength ($\epsilon_w(\lambda, T)$) is a well known tabulated function. Emissivity of the coating is found using equation 2 if temperature of the sample during measurements ($T_{sample}$) is different from that during calibration.

$$\varepsilon(\lambda,\ Tsample) = \frac{Ssample}{Scalib} \cdot \frac{\varepsilon_W(\lambda,\ Tcalib) \cdot BB(\lambda,\ Tcalib)}{BB(\lambda,\ Tsample)}, \quad (2)$$

where $BB(\lambda,\ T)$ gives the thermal radiance of a black body (Plank function).

Auger measurements are performed to provide a quantitative estimation of the coating composition. A focused electron beam is used as an excitation source. Upon sample bombardment, a transfer of energy occurs which excites a core electron in an excited element in the sample into an orbital of higher energy. Once in this excited state, the atom has two possible modes of relaxation: emission of an X-ray, or emission of an Auger electron. In both processes, the emitted particle will have an energy characteristic of the parent element. The emitted Auger electrons are collected and an energy spectrum of the detected electrons is analyzed. The peaks in the energy spectrum are assigned to the elements present. The ratios of the intensities of Auger electron peaks can provide a quantitative estimation of surface composition. Depth profiles are obtained by employing a controlled sputtering process, which enables elemental concentration to be plotted as a function of coating depth. As the present Auger measurement is not a calibrated measurement, the measured concentration is only an estimate of the concentration, although the measured relative concentrations are expected to be substantially accurate. The somewhat higher concentrations of oxygen seen near the surface in the Auger measurement for the following examples is likely due to oxidation in air during handling and is removed in the emissivity apparatus by evaporation, before high-temperature spectral measurements are made.

Example 1

Figure 18:
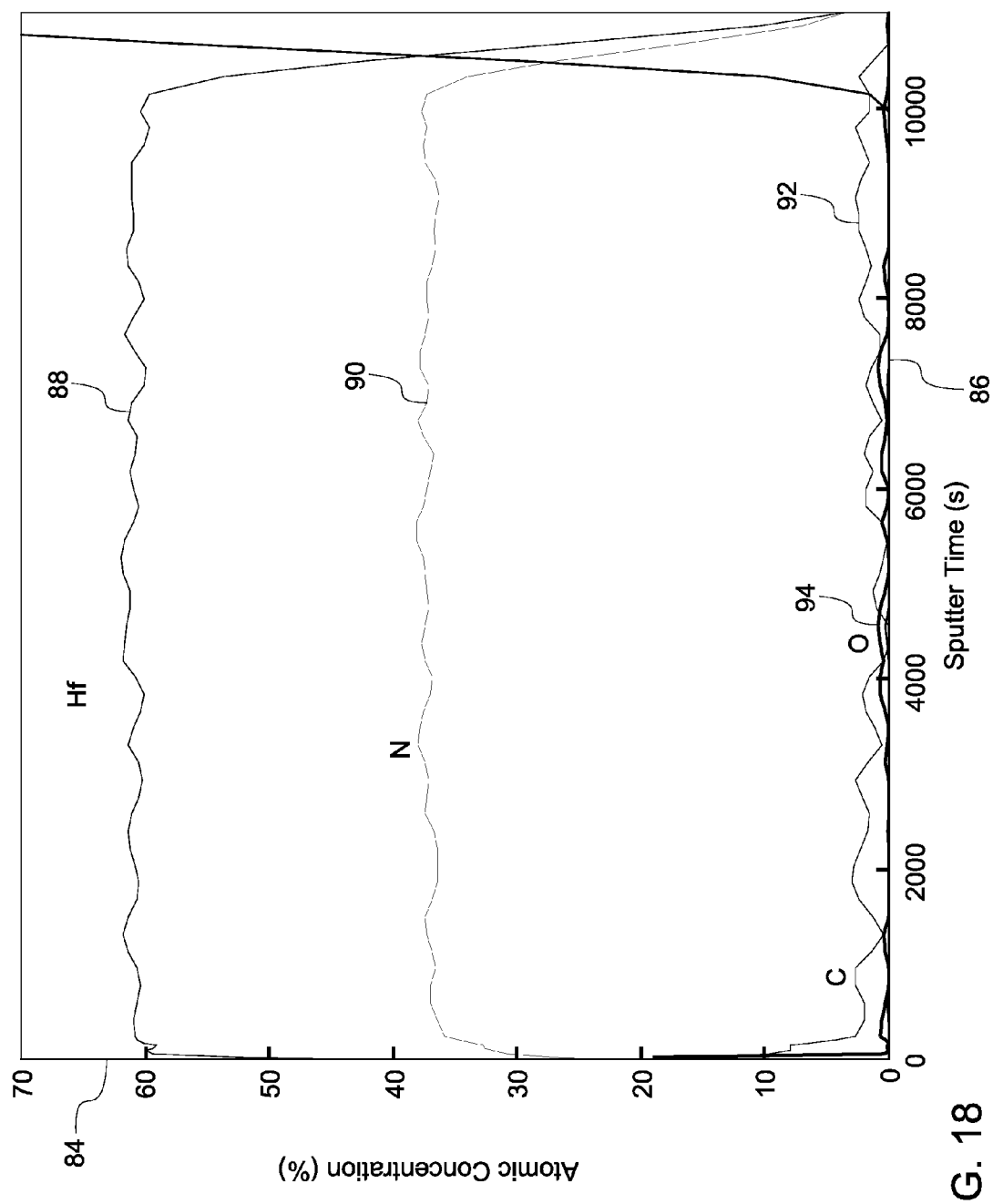
FIG. 18 illustrates the variation in atomic concentration with sputter time for a hafnium carbonitride composition in accordance with one embodiment of the present invention.

In one example, a hafnium carbonitride layer (coating) is formed over a tungsten substrate. To form the hafnium carbonitride layer about 500 nanometer to about 2 micron layer of hafnium nitride (HfN) is deposited over a substrate of tungsten by a CVD process. A small of quantity of carbon is incorporated into the HfN nitride layer from the CVD environment. To determine the constituents of the deposited layer, the Auger measurement described above is performed. FIG. 18 illustrates the variation in atomic concentration (Y-axis 84) with sputter time (X-axis 86). The line plots 88, 90, 92, 94, 96 show the variation in atomic concentration with sputter time for hafnium, nitrogen, carbon, oxygen and tungsten. The line plots 88 and 90 show substantially uniform concentrations of hafnium and nitrogen respectively. Line plot 92 indicates a small amount carbon being present in the coating. Once the coating is essentially sputtered away, the concentration of hafnium, nitrogen, and carbon, drop off, and the concentration of the tungsten (from the substrate) rapidly increases. The average bulk atomic concentrations are estimated to be hafnium 61%, nitrogen 37%, and carbon 2%, with almost 0% of oxygen. Normalized to the concentration of hafnium, the composition may be represented as $HfN_{0.62}C_{0.03}$.

Figure 19:
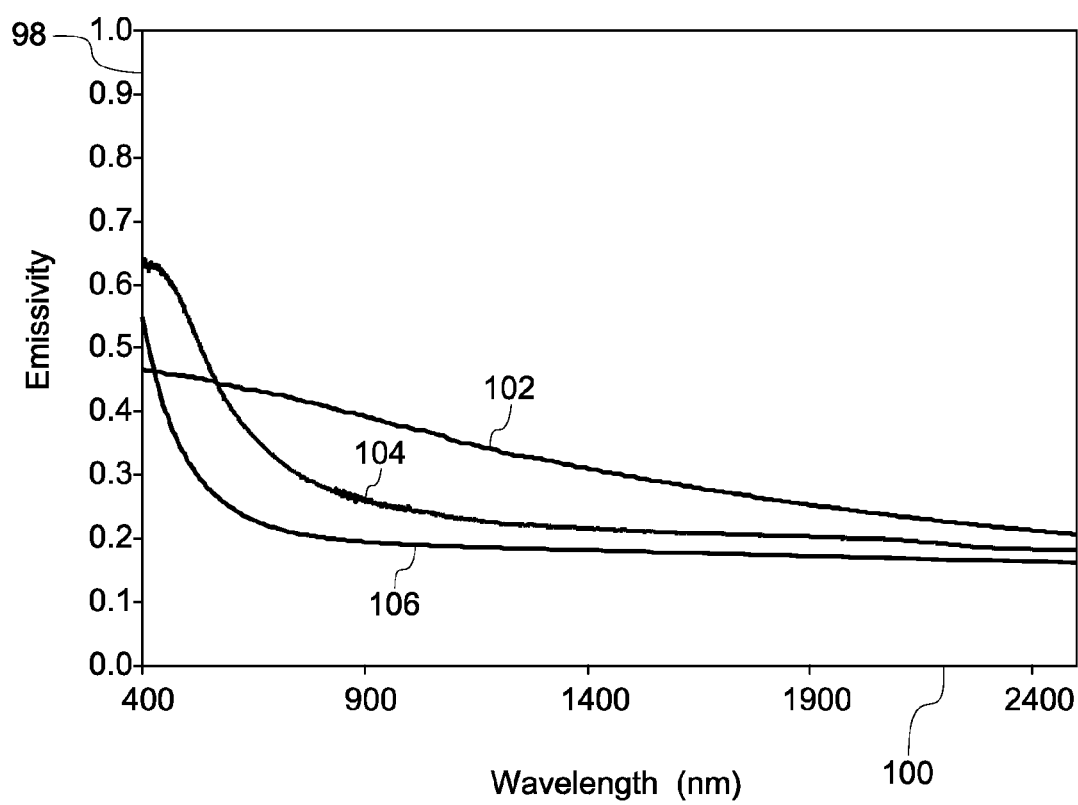
FIG. 19 illustrates the variation in emissivity with wavelength for the hafnium carbonitride composition of FIG. 19, in accordance with one embodiment of the present invention.

Emissivity measurements are performed on the tungsten substrate surface with the coating at a temperature of about 2330 degrees Kelvin. The results are compared to ab-initio calculation for emissivity of hafnium nitride at 2500 degrees Kevin. FIG. 19 illustrates the variation in emissivity (Y-axis 98) with wavelength (X-axis 100). Line plots 102, 104 and 106 show the variation in emissivity with wavelength for the tungsten substrate, the hafnium carbonitride coating and the ab-initio calculated emissivity for hafnium nitride, respectively. The results show that the $HfN_{0.62}C_{0.03}$ coating exhibits a broader emission spectrum in the visible region than HfN, while the emissivity is higher than tungsten for at least a portion of the visible spectrum and the emissivity is less than that of tungsten for at least a portion of the near infrared region of the electromagnetic spectrum.

Example 2

Figure 20:
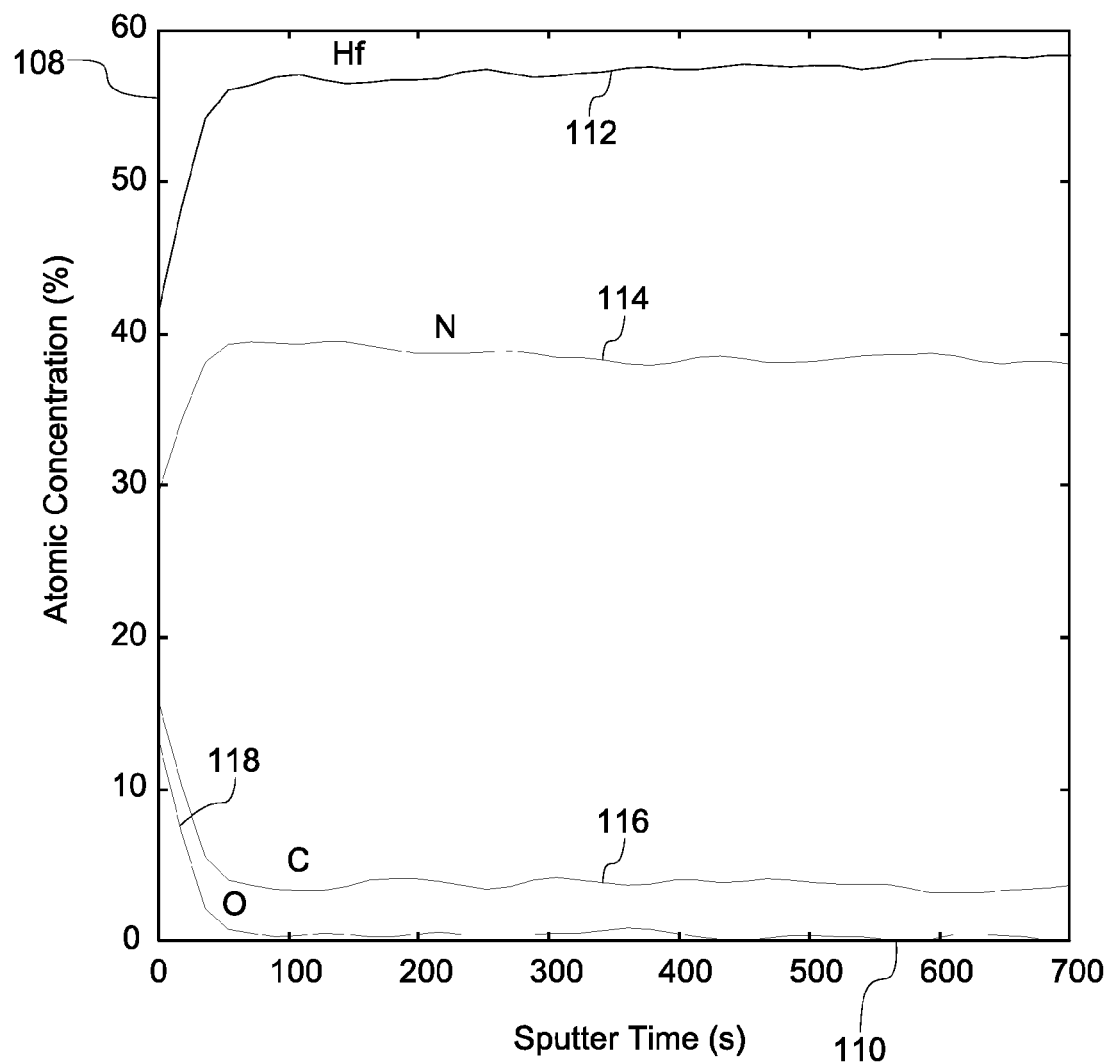
FIG. 20 illustrates the variation in atomic concentration with sputter time for a hafnium carbonitride composition in accordance with one embodiment of the present invention.

In another example, a hafnium carbonitride layer is formed over a tungsten substrate. To form hafnium carbonitride, a layer of hafnium nitride ranging from about 500 nanometers to about 2 microns is deposited over a substrate of tungsten by a sputtering process. A small amount of carbon is incorporated into the hafnium nitride layer from the sputtering environment. To determine the constituents of the deposited layer, the Auger measurement described above is performed. FIG. 20 illustrates the variation in atomic concentration (Y-axis 108) with sputter time (X-axis 110). The line plots 112, and 114, indicate substantially uniform concentrations of hafnium and nitrogen respectively. Line plot 116 indicates a small amount of carbon being present in the coating, while line plot 118 indicates very little oxygen present, specifically beyond a few atomic layers of the surface. The average bulk atomic concentrations are estimated to be hafnium 57%, nitrogen 38%, and carbon 5%, with almost 0% of oxygen. Normalized to the concentration of hafnium, the composition may be represented as $HfN_{0.67}C_{0.09}$.

Figure 21:
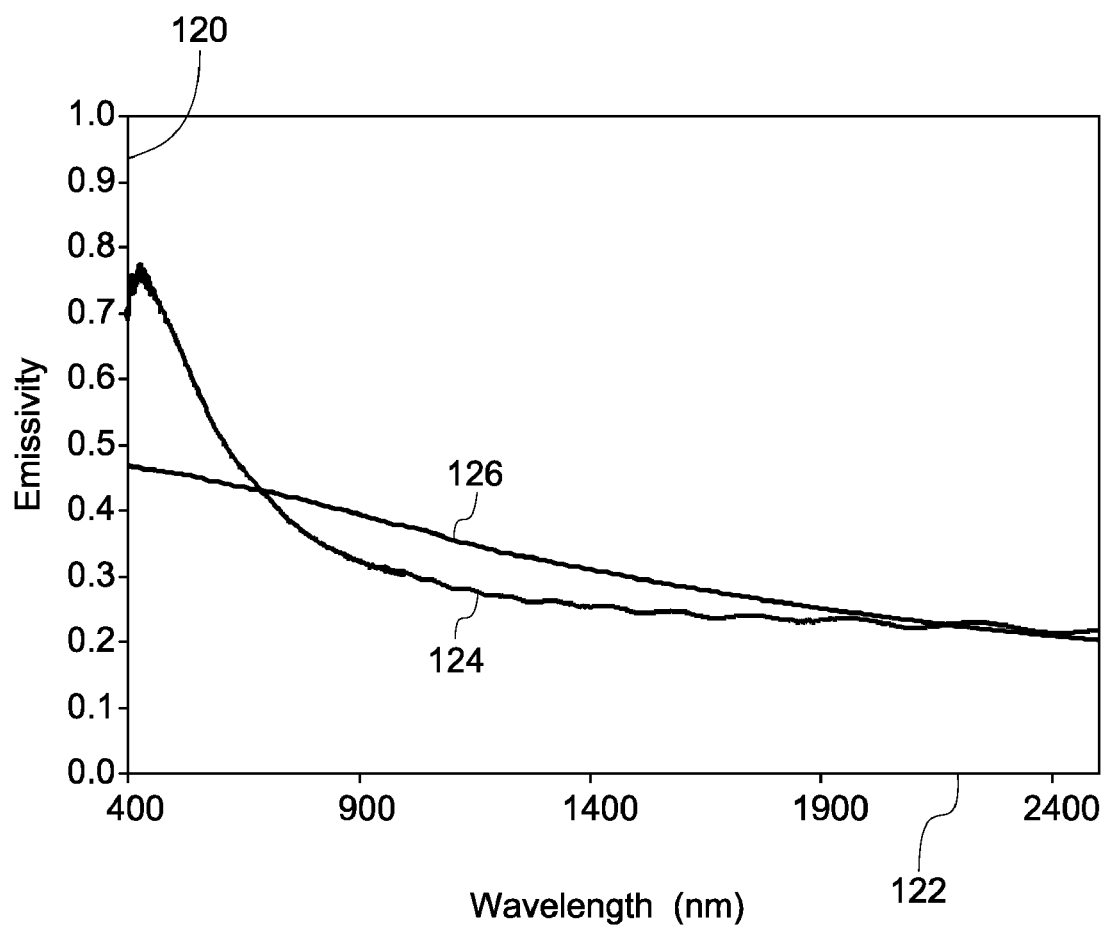
FIG. 21 illustrates the variation in emissivity with wavelength for the hafnium carbonitride composition of FIG. 20, in accordance with one embodiment of the present invention.

Emissivity measurements are also performed on the substrate with the coating at about 2255 degrees Kelvin. FIG. 21 illustrates the variation in emissivity (Y-axis 120) with wavelength (X-axis 122). Line plots 124 and 126 show the variation in emissivity with wavelength for the hafnium carbonitride coating and the tungsten substrate respectively. The results show that the $HfN_{0.67}C_{0.09}$ coating exhibits a broad emission spectrum in the visible region and a higher emissivity than tungsten for almost the entire portion of the visible spectrum and the emissivity is less than that of tungsten for at least a portion of the near infrared region of the spectrum.

Example 3

Figure 22:
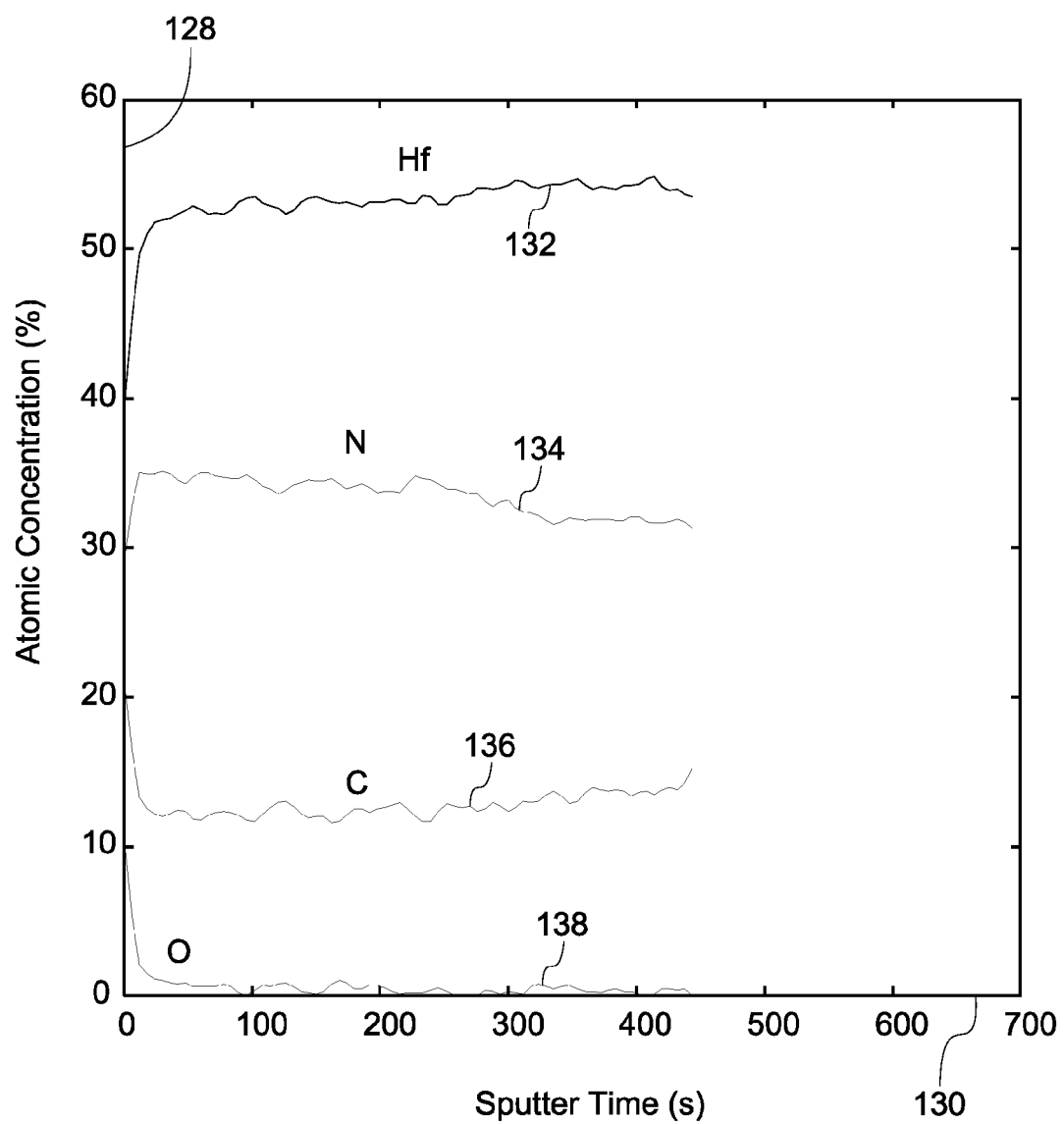
FIG. 22 illustrates the variation in atomic concentration with sputter time for a hafnium carbonitride composition in accordance with one embodiment of the present invention.

In still another example, a hafnium carbonitride layer is formed over a tungsten substrate. To form hafnium carbonitride, a layer of hafnium nitride ranging from about 500 nanometer to about 2 micron is deposited over a substrate of tungsten carbide ($W_2C$) by a sputtering process. To determine the constituents of the deposited layer, the Auger technique described above is performed. FIG. 22 illustrates the variation in atomic concentration (Y-axis 128) with sputter time (X-axis 130). The line plots 132, 134, 136 and 138 show the variation in atomic concentration with sputter time for hafnium, nitrogen, carbon, and oxygen. The line plots 132 and 134 show substantially uniform concentrations of hafnium and nitrogen respectively. Line plot 136 indicates an amount greater than 10% of carbon being present through the coating with negligible amount of oxygen being present. The average bulk atomic concentrations were estimated to be hafnium 54%, nitrogen 34%, carbon 12%, with almost 0% of oxygen. Normalized to the concentration of hafnium, the composition may be represented as $HfN_{0.63}C_{0.22}$.

Figure 23:
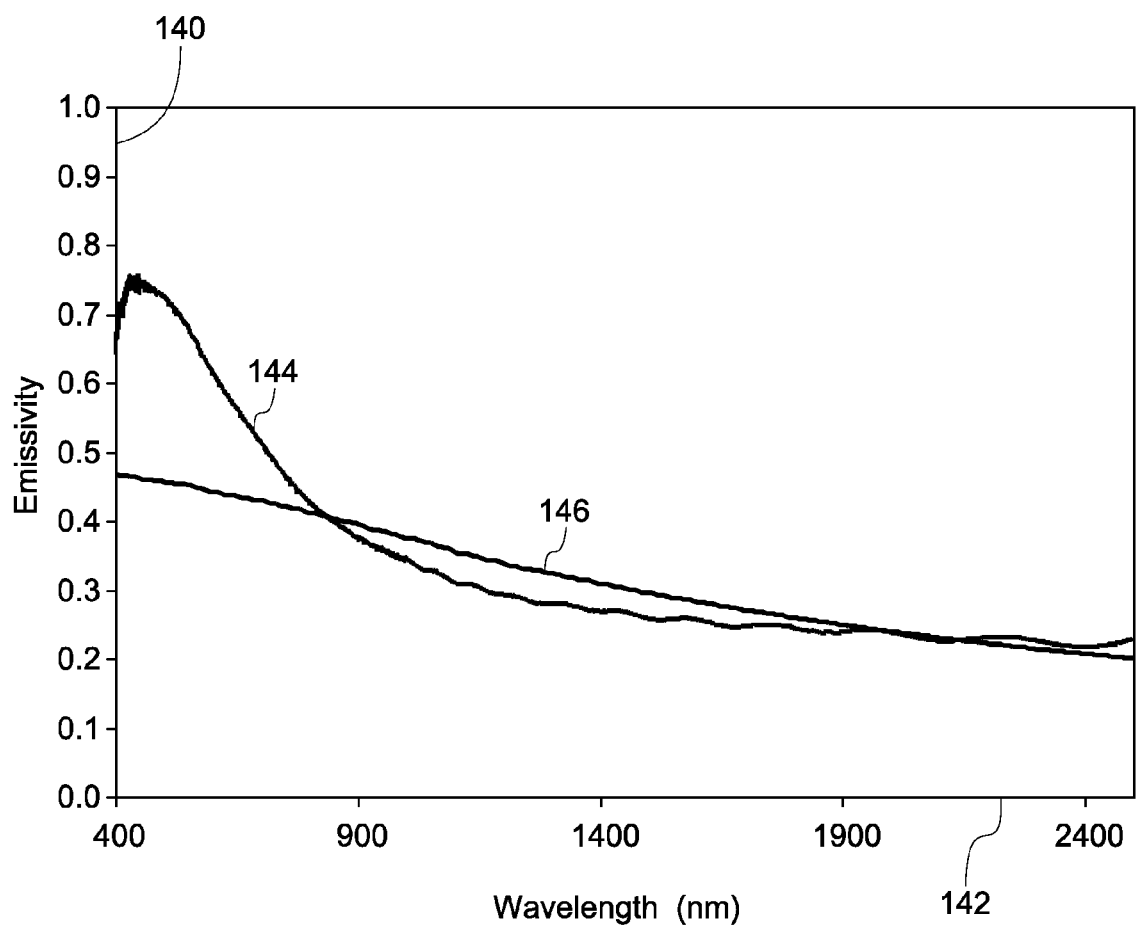
FIG. 23 illustrates the variation in emissivity with wavelength for the hafnium carbonitride composition of FIG. 22, in accordance with one embodiment of the present invention.

Emissivity measurements are performed on the substrate with the coating at temperature of 2226 degrees Kelvin. FIG. 23 illustrates the variation in emissivity (Y-axis 140) with wavelength (X-axis 142). Line plots 144 and 146 show the variation in emissivity with wavelength for the hafnium carbonitride coating and the tungsten substrate. The results show that the $HfN_{0.63}C_{0.22}$ coating exhibits a broad emission spectrum in the visible region and a higher emissivity than tungsten for the entire portion of the visible spectrum.

Example 4

Figure 24:
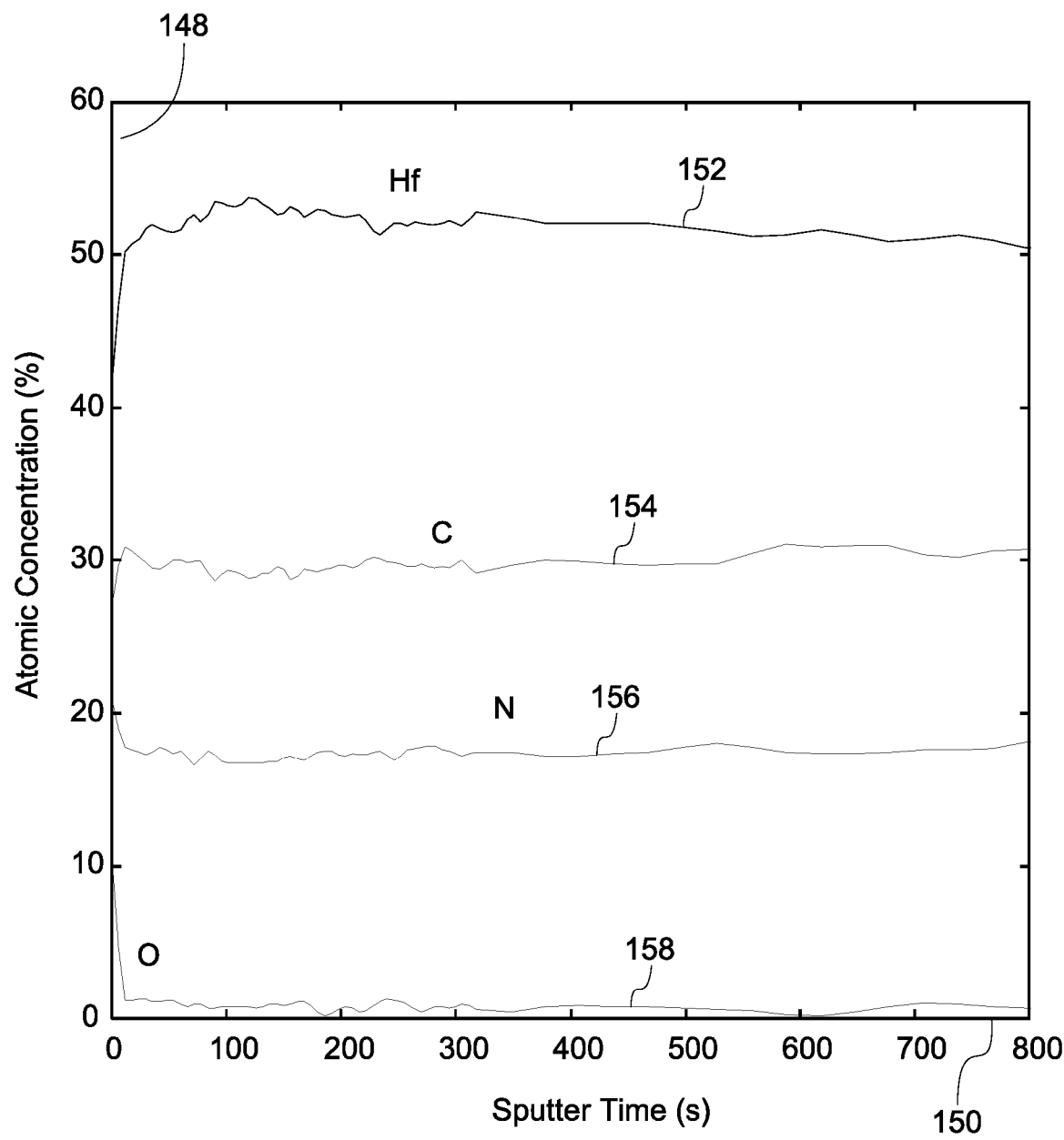
FIG. 24 illustrates the variation in atomic concentration with sputter time for a hafnium carbonitride composition in accordance with one embodiment of the present invention.

In still another example, a hafnium oxycarbonitride layer is formed over a tungsten substrate. To form a hafnium oxycarbonitride layer, a layer of hafnium nitride ranging from about 500 nanometer to about 2 micron is deposited over a substrate of tungsten carbide ($W_2C$) by a sputtering process. The substrate with the coating is then heat treated to incorporate carbon and oxygen into the coating. To determine the constituents of the deposited layer, the Auger technique described above is performed. FIG. 24 illustrates the variation in atomic concentration (Y-axis 148) with Auger sputter time (X-axis 150). The line plots 152, 154, 156 and 158 show the variation in atomic concentration with sputter time for hafnium, nitrogen, carbon, and oxygen. The line plots 152 and 154 show substantially uniform concentrations of hafnium and carbon respectively. Line plot 156 indicates an amount equal to about 18% of nitrogen being present in the coating with negligible amount of oxygen being present. The average bulk atomic concentrations were estimated to be hafnium 52%, nitrogen 17 percent, carbon 30%, with almost 1% of oxygen. Normalized to the concentration of hafnium, the composition may be represented as $HfN_{0.33}C_{0.58}O_{0.02}$.

Figure 25:
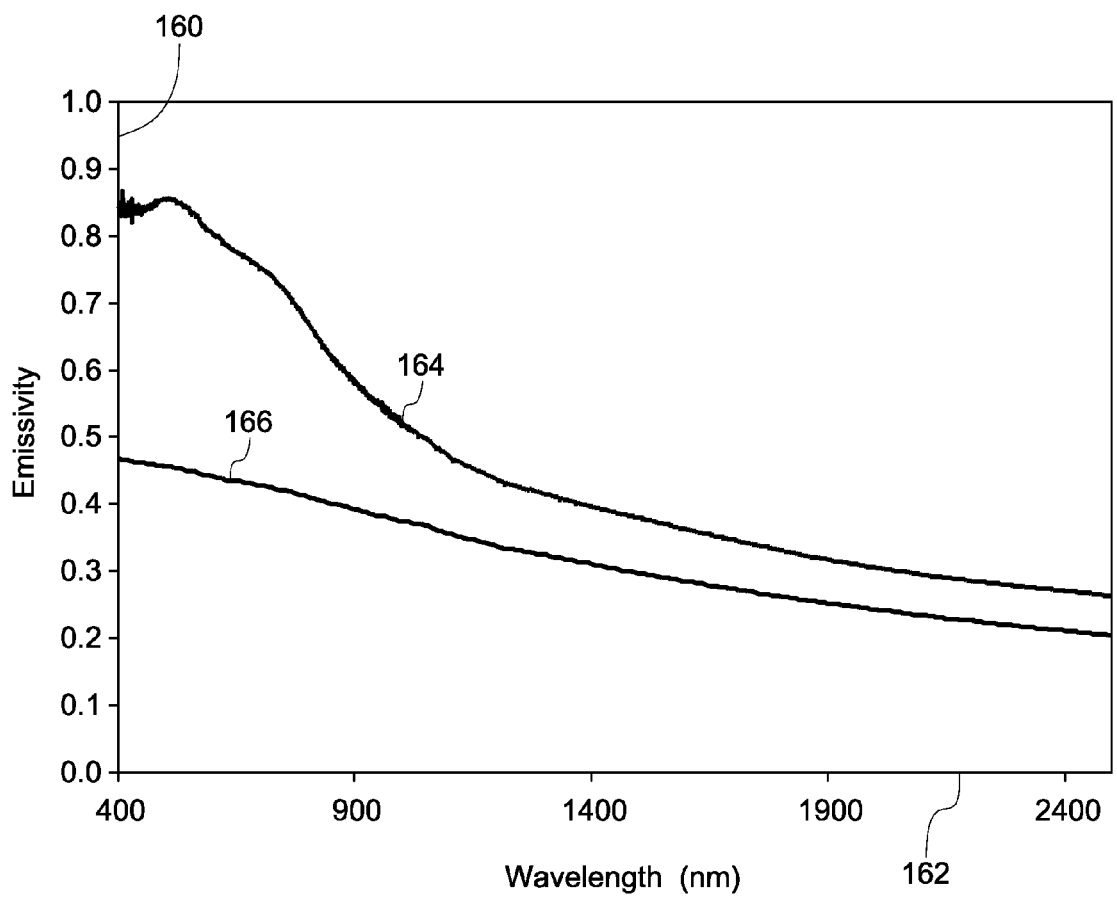
FIG. 25 illustrates the variation in emissivity with wavelength for the hafnium carbonitride composition of FIG. 24, in accordance with one embodiment of the present invention.

Emissivity measurements are performed on the substrate with the coating at a temperature of 2340 degree Kelvin. FIG. 25 illustrates the variation in emissivity (Y-axis 160) with wavelength (X-axis 162). Line plots 164 and 166 show the variation in emissivity with wavelength for the hafnium carbonitride coating and the tungsten substrate. The results show that the $HfN_{0.33}C_{0.58}O_{0.04}$ coating exhibits a broad emission spectrum in the visible region and a higher emissivity than tungsten for the entire portion of the visible spectrum and for the measured portion of the near infrared region as well.

Example 5

Figure 26:
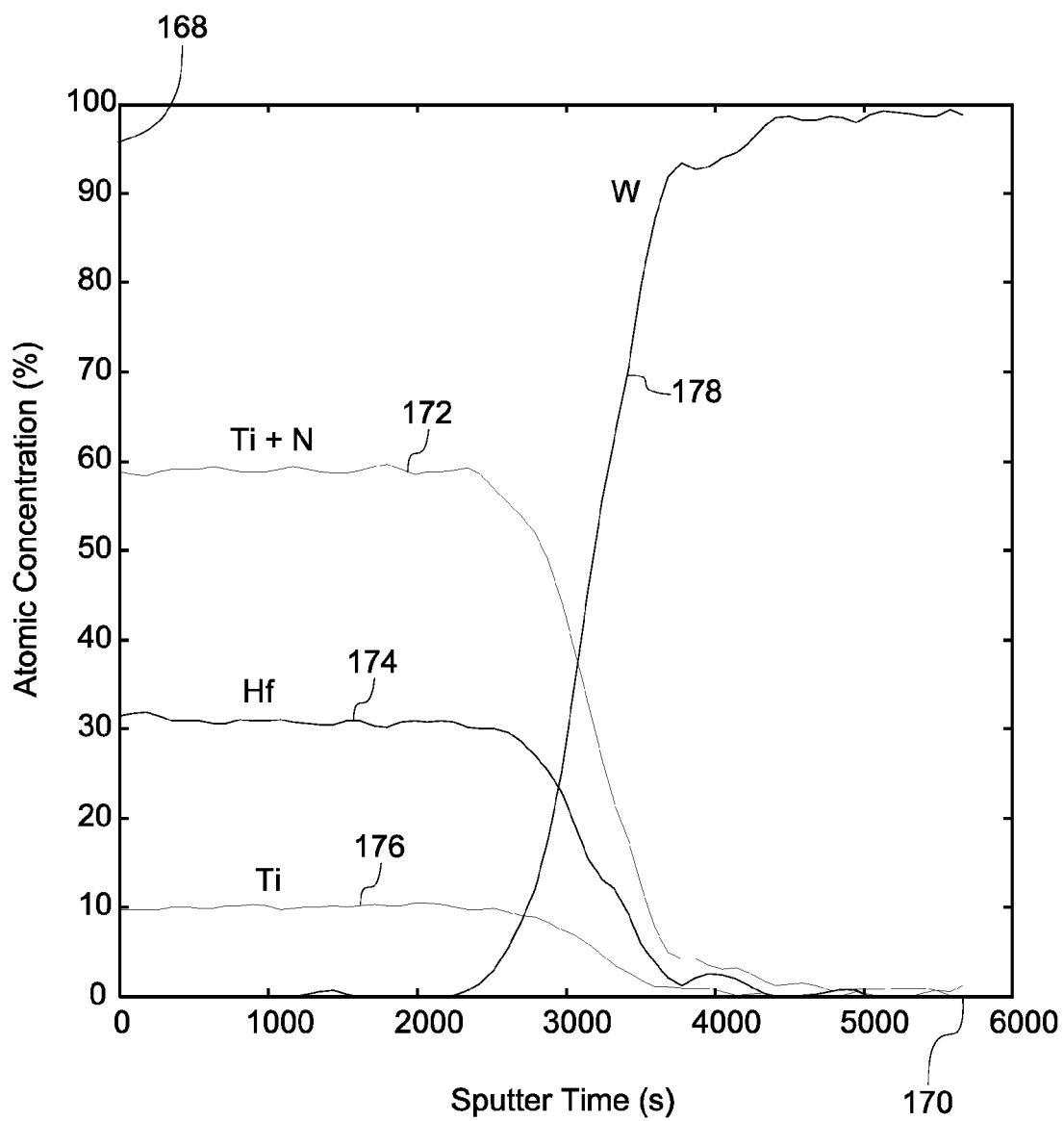
FIG. 26 illustrates the variation in atomic concentration with sputter time for a titanium hafnium nitride composition in accordance with one embodiment of the present invention.

In yet another example, a layer of titanium hafnium nitride is formed over a tungsten substrate. To form a titanium hafnium nitride layer, titanium carbide is deposited over a substrate of tungsten by sputtering and hafnium nitride is deposited over a titanium coated substrate of tungsten by CVD processes. The substrate with the coating is then subjected to heat treatment to interdiffuse the materials to form the desired titanium hafnium nitride coating. A 4% concentration of hydrogen, balance nitrogen, in the test environment has removed all of the carbon from the coating. To determine the constituents of the deposited layer, the Auger technique described above is performed. FIG. 26 illustrates the variation in atomic concentration (Y-axis 168) with sputter time (X-axis 170). The line plots 172, 174, 176 and 178 show the variation in atomic concentration with sputter time for the combined peaks of titanium and nitrogen, for hafnium, for titanium, and tungsten respectively. The close proximity of the emitted titanium and nitrogen Auger electrons at certain energies do not allow for independent quantification of the titanium and nitrogen concentrations in this example.

Figure 27:
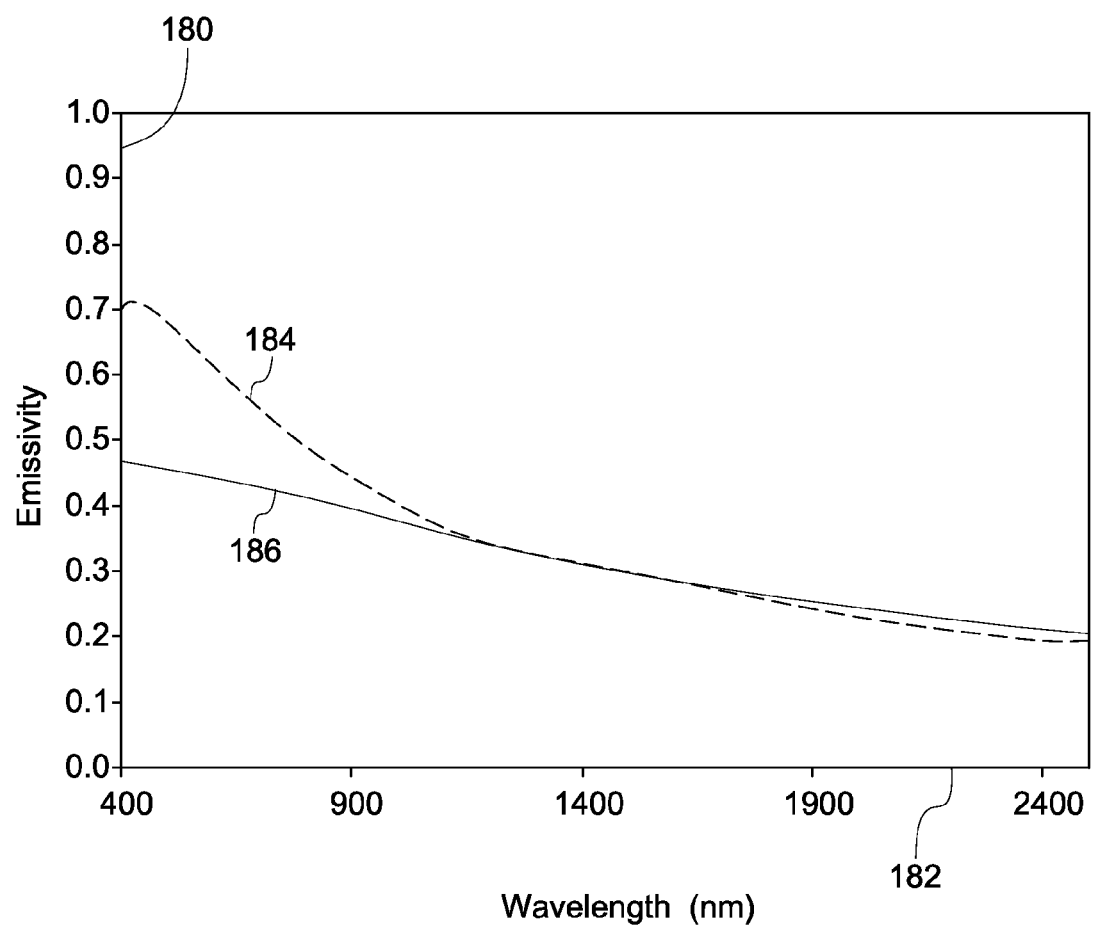
FIG. 27 illustrates the variation in emissivity with wavelength for the titanium hafnium nitride composition of FIG. 26, in accordance with one embodiment of the present invention.

Emissivity measurements are performed on the substrate with the coating at temperature of 2288 degrees Kelvin. FIG. 27 illustrates the variation in emissivity (Y-axis 180) with wavelength (X-axis 182). Line plots 184 and 186 show the variation in emissivity with wavelength for the hafnium carbonitride coating and the tungsten substrate. The results show that the hafnium titanium nitride coating exhibits a broad emission spectrum in the visible region and a higher emissivity than tungsten for the entire portion of the visible spectrum.

While only certain features of the invention have been illustrated and described herein, many modifications and changes may occur to those skilled in the art. It is, therefore, to be understood that the appended claims are intended to cover all such modifications and changes as may fall within the spirit and scope of the invention.

What is claimed is:

1. A radiation emitter comprising:
   a luminous element disposed on a refractory metal substrate and configured to emit thermal radiation in the visible region of the electromagnetic spectrum when heated to a temperature greater than about 2000 degrees Kelvin, the luminous element comprising a hafnium carbonitride, zirconium carbonitride, molybdenum carbonitride, or combinations thereof.

2. The radiation emitter of claim 1, wherein the luminous element is disposed as a coating over the substrate.

3. The radiation emitter of claim 1, wherein the luminous element is embedded into the substrate.

4. The radiation emitter of claim 1, wherein the luminous element is incorporated into the substrate as a second phase.

5. The radiation emitter of claim 1, further comprising electrical leads to supply electrical energy to the luminous element.

6. The radiation emitter of claim 5, wherein the electrical leads and the luminous element form a unitary structure.

7. The radiation emitter of claim 1, wherein the luminous element comprises a coiled element.

8. The radiation emitter of claim 1, wherein the luminous element comprises a planar element.

9. The radiation emitter of claim 8, wherein the planar element comprises a planar ribbon element.

10. The radiation emitter of claim 1, further comprising a protective transparent layer disposed over the luminous element.

11. A radiation source comprising:
    a base;
    a light-transmissive envelope coupled to the base; and
    a thermo-optically functional composition disposed within the light-transmissive envelope, wherein the thermo-optically functional composition is coated on a refractory metal substrate and selected from hafnium carbonitride, zirconium carbonitride, molybdenum carbonitride, or combinations thereof.

12. The radiation source of claim 11, further comprising a gas phase.

13. A radiation emitter comprising:
    a luminous element disposed as a coating on two sides of a refractory metal substrate and configured to emit thermal radiation in the visible region of the electromagnetic spectrum, the luminous element comprising a hafnium carbonitride, zirconium carbonitride, molybdenum carbonitride, or combinations thereof.

14. The radiation emitter of claim 13, wherein the substrate comprises tungsten.

15. The radiation emitter of claim 13, wherein the substrate is a tungsten coil.

16. The radiation emitter of claim 13, wherein the luminous element is hafnium carbonitride.

17. The radiation emitter of claim 16, wherein the hafnium carbonitride is of the composition $H(C_xN_y)_m$, where xm and ym are in a range from about 0.05 to about 0.7.

18. The radiation emitter of claim 16, wherein the hafnium carbonitride has a sub-stoichiometric composition.

19. The radiation emitter of claim 13, wherein a thickness of the coating is in a range from about 500 nanometers to about 10 microns.

20. The radiation emitter of claim 13, wherein a grain size of the luminous element is in a range from about 100 nanometers to about 100 microns.

21. The radiation emitter of claim 13, wherein a porosity of the coating is less than about 5 volume % of the total coating.

* * * * *